United States Patent
Maruyama et al.

(10) Patent No.: US 8,934,324 B2
(45) Date of Patent: Jan. 13, 2015

(54) LIGHT SOURCE AND RECORDING APPARATUS

(71) Applicant: Sony Corporation, Tokyo (JP)

(72) Inventors: Tsutomu Maruyama, Kanagawa (JP); Goro Fujita, Kanagawa (JP)

(73) Assignee: Sony Corporation, Tokyo (JP)

( * ) Notice: Subject to any disclaimer, the term of this patent is extended or adjusted under 35 U.S.C. 154(b) by 19 days.

(21) Appl. No.: 13/774,657

(22) Filed: Feb. 22, 2013

(65) Prior Publication Data
US 2013/0235710 A1    Sep. 12, 2013

(30) Foreign Application Priority Data

Mar. 6, 2012   (JP) ................. 2012-049130

(51) Int. Cl.

| | |
|---|---|
| H01S 3/098 | (2006.01) |
| H01S 5/00 | (2006.01) |
| G02F 1/01 | (2006.01) |
| G11B 7/0045 | (2006.01) |
| H01S 5/065 | (2006.01) |
| H01S 5/062 | (2006.01) |
| G11B 7/127 | (2012.01) |
| H01S 5/06 | (2006.01) |
| H01S 5/14 | (2006.01) |

(Continued)

(52) U.S. Cl.
CPC ............ *H01S 5/0085* (2013.01); *G11B 7/0045* (2013.01); *H01S 5/0657* (2013.01); *H01S 5/06246* (2013.01); *G11B 7/127* (2013.01); *H01S 5/0028* (2013.01); *H01S 5/0602* (2013.01); *H01S 5/141* (2013.01); *H01S 5/22* (2013.01); *H01S 5/4006* (2013.01)

USPC ............. 369/116; 369/47.19; 369/44.25; 372/18; 372/29.01; 372/38.02

(58) Field of Classification Search
USPC ............. 369/47.28, 44.25, 44.28; 372/18; 347/248; 385/14; 398/155, 175
See application file for complete search history.

(56) References Cited

U.S. PATENT DOCUMENTS

| | | | | |
|---|---|---|---|---|
| 7,103,079 | B2 * | 9/2006 | McInerney et al. | 372/38.02 |
| 8,416,671 | B2 * | 4/2013 | Fujita et al. | 369/116 |
| 2002/0006141 | A1 * | 1/2002 | Ogura | 372/18 |

(Continued)

OTHER PUBLICATIONS

Kobayashi et al, "Introduction of volumetric optical storage technology "Micro-reflector", an ultra-multilayer optical disk." (1 page).

(Continued)

*Primary Examiner* — Wayne Young
*Assistant Examiner* — Dionne Pendleton
(74) *Attorney, Agent, or Firm* — K&L Gates LLP (57) ABSTRACT

There is provided a light source including a mode-lock laser unit that includes a semiconductor laser and an external resonator unit and emits a laser beam having a predetermined frequency, the semiconductor laser including a saturable absorber unit that applies a reverse bias voltage and a gain unit that applies a gain current, a semiconductor optical amplifier that performs amplification modulation on the laser beam emitted from the mode-lock laser unit, a laser clock generating unit that generates a laser clock synchronized with the laser beam based on a signal detected from the saturable absorber unit when the laser beam oscillates in the mode-lock laser unit, and a modulating unit that generates a driving current synchronized with the laser clock and applies the driving current to the semiconductor optical amplifier.

2 Claims, 9 Drawing Sheets

(51) Int. Cl.
  *H01S 5/22* (2006.01)
  *H01S 5/40* (2006.01)

(56) References Cited

U.S. PATENT DOCUMENTS

| | | | |
|---|---|---|---|
| 2003/0012235 A1* | 1/2003 | Yokoyama | 372/25 |
| 2006/0222024 A1* | 10/2006 | Gray et al. | 372/18 |
| 2008/0025358 A1* | 1/2008 | Arahira | 372/38.02 |
| 2009/0122815 A1* | 5/2009 | Jiang et al. | 372/18 |
| 2009/0245043 A1* | 10/2009 | Ueda | 369/47.5 |
| 2010/0246612 A1* | 9/2010 | Shimizu | 372/18 |

OTHER PUBLICATIONS

Kuramoto et al., "Enormously high-peak-power optical pulse generation from a single-transverse-mode GaInN blue-violet laser diode," Applied Physics Letters 96, 2010. (3 pages).

Koda et al., "100 W peak-power 1 GHz repetition picoseconds optical pulse generation using blue-violet GaInN diode laser mode-locked oscillator and optical amplifier," Applied Physics Letters 97, 2010. (3 pages).

Spectra-Physics, Tsunami® Series Ti:Sapphire Ultrafast Oscillators, Specifications brochure, 2008. (4 pages).

* cited by examiner

LIGHT SOURCE AND RECORDING APPARATUS

CROSS REFERENCES TO RELATED APPLICATIONS

The present application claims priority to Japanese Priority Patent Application JP 2012-049130 filed in the Japan Patent Office on Mar. 6, 2012, the entire content of which is hereby incorporated by reference.

BACKGROUND

The present application relates to a light source using a master oscillator power amplifier (MOPA) in which a mode-lock oscillating laser is combined with an optical amplifier, and a recording apparatus using the light source.

A laser beam having high-peak power, particularly, intense pulsed light is very effective in implementing a non-linear multi-photon absorption process, and expected to be applied to three-dimensional optical recording or a ultrafine process using the absorption process, non-destructive bio-imaging, or the like.

For example, in "Seiji Kobayashi, Kimihiro Saito, Takashi Iwamura, Hisayuki Yamatsu, Toshihiro Horigome, Mitsuaki Oyamada, Kunihiko Hayashi, Daisuke Ueda, Norihiro Tanabe, and Hirotaka Miyamoto, ISOM2009 Digest Th-1-01, 2009," a method of irradiating a transparent bulk material having a non-linear effect with a high-power laser beam and implementing multi-layer recording has been reported. This method represents a possibility of a recording medium which is cheaper and larger in capacity than a stack-type disk of a related art. A mode-lock type titanium-sapphire laser is used as a light source that emits a high-power laser beam. In the example of "Seiji Kobayashi, Kimihiro Saito, Takashi Iwamura, Hisayuki Yamatsu, Toshihiro Horigome, Mitsuaki Oyamada, Kunihiko Hayashi, Daisuke Ueda, Norihiro Tanabe, and Hirotaka Miyamoto, ISOM2009 Digest Th-1-01, 2009," a light source for short wavelength recording advantageous for high-density recording is implemented such that emitting light with a wavelength of 810 nm emitted from the titanium-sapphire laser is converted into light with a wavelength of 405 nm by a second harmonic generator (SHG). The solid-state laser is large in device size and high in price, and thus its application is limited to experiments in laboratories (for example, see Spectra-Physics, [online], [searched on Aug. 6, 2010], Internet <URL:http://www.spectraphysics.jp/member/admin/document_upload/Tsunami_Series-_Data_Sheet.pdf>).

In this regard, many researchers have made an attempt to develop a pulse light source which is smaller and cheaper in practical use based on a semiconductor. In next-general optical recording as in the above-mentioned method, a violet-blue laser source advantages to high-density recording is in strong demand.

For example, in a gain switching type laser, there have been reports that when oscillation of a laser beam is performed at a repetition frequency of 1 MHz by strong excitation driving, peak power of 55 W can be implemented (see M. Kuramoto, T. Oki, T. Sugahara, S. Kono, M. Ikeda, and H. Yokoyama, Appl. Phys. Lett. 96, 051102_2010_.). However, due to the demand on a high data transfer rate in the market, a high repetition frequency is necessary even in a light source for data recording.

In recent years, in a blue laser effective for high-density recording, there have been reported a light source in which a laser beam having peak power of 100 W oscillates at a repetition frequency of 1 GHz (for example, see Rintaro Koda, Tomoyuki Oki, Takao Miyajima, Hideki Watanabe, Masaru Kuramoto, Masao Ikeda, and Hiroyuki Yokoyama, APPLIED PHYSICS LETTERS 97, 021101_2010_). This light source is called an MOPA, and configured such that a semiconductor mode-lock laser is combined with a semiconductor optical amplifier.

SUMMARY

As described above, a light source that can oscillate pulse light of a high repetition frequency needs to be further improved for applications in the field of industry or science.

In light of the foregoing, the present application is directed to provide a light source by which synchronization between an oscillation pulse of a laser beam and modulation of a laser beam is easily obtained by a simple configuration. Further, the present disclosure is directed to provide a recording apparatus using the light source.

According to an embodiment of the present disclosure, there is provided a light source which includes a mode-lock laser unit, a semiconductor optical amplifier, a laser clock generating unit, and a modulating unit. The mode-lock laser unit includes a semiconductor laser and an external resonator unit and emits a laser beam having a predetermined frequency, the semiconductor laser including a saturable absorber unit that applies a reverse bias voltage and a gain unit that applies a gain current. The semiconductor optical amplifier performs amplification modulation on the laser beam emitted from the mode-lock laser unit. The laser clock generating unit generates a laser clock synchronized with the laser beam from a signal detected from the saturable absorber unit when the laser beam oscillates in the mode-lock laser unit. The modulating unit generates a driving current synchronized with the laser clock and applies the driving current to the semiconductor optical amplifier.

In the light source according to the present disclosure, the laser clock generated by the laser clock generating unit is synchronized with the laser beam emitted from the mode-lock laser unit. Thus, in the present disclosure, by generating the driving current using the detected laser clock, an oscillation pulse of the laser beam emitted from the mode-lock laser unit can be synchronized with modulation of the laser beam by the semiconductor optical amplifier.

According to another embodiment of the present disclosure, there is provided a recording apparatus which includes a mode-lock laser unit, a semiconductor optical amplifier, a laser clock generating unit, a recording signal generating unit, and a modulating unit. The mode-lock laser unit includes a semiconductor laser and an external resonator unit and emits a laser beam having a predetermined frequency, the semiconductor laser including a saturable absorber unit that applies a reverse bias voltage and a gain unit that applies a gain current. The semiconductor optical amplifier performs amplification modulation on the laser beam emitted from the mode-lock laser unit. The laser clock generating unit generates a laser clock synchronized with the laser beam from a signal detected from the saturable absorber unit when the laser beam oscillates in the mode-lock laser unit. The recording signal generating that generates a recording signal based on a reference signal from a drive of an optical recording medium. The modulating unit latches the recording signal by the laser clock, and generates a driving current to be applied to the semiconductor optical amplifier.

In the recording apparatus according to the present disclosure, the laser clock generated by the laser clock generating unit is synchronized with the laser beam emitted from the mode-lock laser unit. The recording signal generated by the recording signal generating unit is latched by the laser clock in the modulating unit. Thus, by generating the driving current using the detected laser clock, an oscillation pulse of the laser beam emitted from the mode-lock laser unit can be synchronized with modulation of the laser beam by the semiconductor optical amplifier.

According to the embodiments of the present application, since an oscillation pulse of a laser beam can be synchronized with a modulation signal of a laser beam, even in a laser beam having a very high pulse light frequency, a light pulse of a laser beam can be easily synchronized with a modulation of a laser beam.

Additional features and advantages are described herein, and will be apparent from the following Detailed Description and the figures.

DETAILED DESCRIPTION

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The proposer(s) of the present application has (have) found the following problems in development of a light source and a recording apparatus using an MOPA.

In a recording/reproducing apparatus, a recording address is allocated to recording data for each recording unit in advance, and recording data is recorded at a corresponding position based on a wobbling signal in which address information is embedded on an optical recording medium in advance. Thus, at the time of replay, a beam is accessed based on address information, and so desired data can be replayed.

In a recording apparatus that performs recording on an optical disk represented by a recording DVD, a Blu-ray disc (a registered trademark), or the like, a data clock is generated using a fundamental wave of a wobbling signal in which address information of an optical disk is embedded. Further, in the recording apparatus, recording is performed such that the optical disk is irradiated with a laser pulse that modulates recording data in synchronization with the data clock.

Even when an MOPA configured with a mode-lock laser and a semiconductor optical amplifier is used for recording, it is necessary to perform recording while synchronizing modulation of recording data with an oscillation pulse of a laser beam. As described above, when the MOPA using the mode-lock laser is applied to the recording/reproducing apparatus, modulation of recording data can be performed by externally driving the semiconductor optical amplifier.

However, when the MOPA is applied to the recording/reproducing apparatus, if an oscillation pulse of a laser beam oscillating from the mode-lock laser is not in synchronization with modulation of a laser beam by recording data, the number of recording pulses changes, and thus a recording mark is not accurately written.

Figure 11:
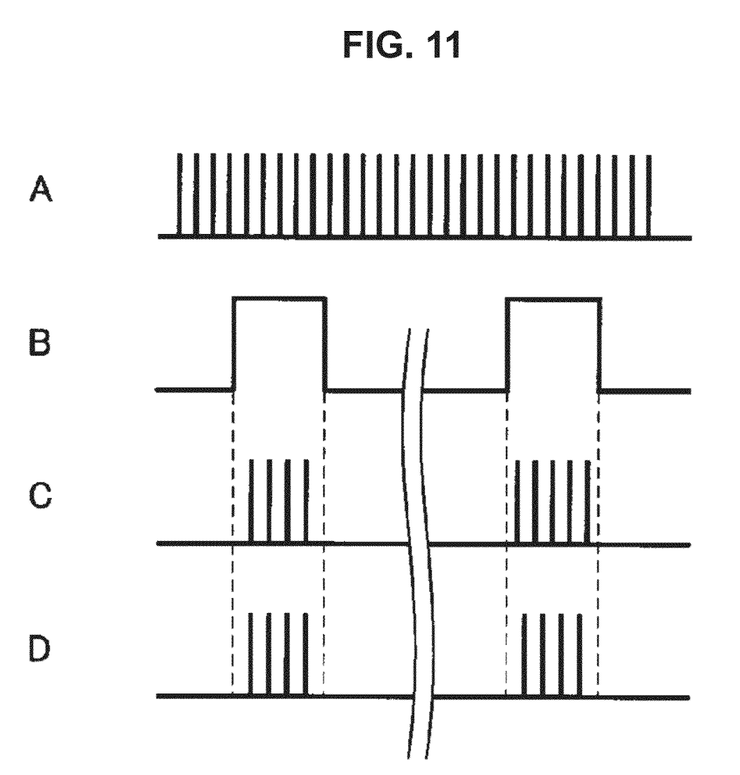
FIGS. 11A to 11D are diagrams illustrating a waveform of an output pulse when a laser beam oscillated from a mode-lock laser is synchronized with a driving waveform of a semiconductor optical amplifier and a waveform of an output pulse when a laser beam oscillated from a mode-lock laser is not synchronized with a driving waveform of a semiconductor optical amplifier.

FIGS. 11A to 11D are schematic diagrams illustrating a waveform of an output pulse output from the MOPA when the laser beam oscillating from the mode-lock laser is synchronized with a driving waveform of the semiconductor optical amplifier and a waveform of an output pulse when the laser beam oscillated from the mode-lock laser is not synchronized with the driving waveform of the semiconductor optical amplifier. FIG. 11A illustrates a waveform of the laser beam oscillating from the mode-lock laser. FIG. 11B illustrates a waveform of a driving current (corresponding to recording data) used to drive the semiconductor optical amplifier. FIG. 11C illustrates a waveform of an output pulse output from the MOPA when the laser beam oscillating from the mode-lock laser is not synchronized with the driving waveform of the semiconductor optical amplifier (an asynchronized case). FIG. 11D illustrates a waveform of an output pulse output from the MOPA when the laser beam oscillating from the mode-lock laser is synchronized with the driving waveform of the semiconductor optical amplifier. FIGS. 11A to 11D illustrate an example in which the number of pulses output from the MOPA is 4 when the semiconductor optical amplifier is driven to amplify a pulse corresponding to recording data of the same length.

In the case in which the laser beam emitted from the mode-lock laser is synchronized with the driving current for driving the semiconductor optical amplifier at an optimal phase, pulse light having the same number of pulses can be output when the pulse width of the driving current is the same as illustrated in FIG. 11D.

However, in the case in which the laser beam emitted from the mode-lock laser is not synchronized with the driving current for driving the semiconductor optical amplifier at an optimal phase, even when the pulse width of the driving current is the same, for example, the pulse light corresponding to five pulses is output as illustrated in FIG. 11C.

As described above, when the driving current of the semiconductor optical amplifier is not synchronized with the laser beam oscillating from the mode-lock laser, the number of pulses output from the semiconductor optical amplifier changes. This phenomenon greatly affects the recording accuracy according to an increase in a transfer rate or a reduction in the pulse width of the driving current.

Based on the above considerations, the proposer(s) of the present application has (have) finally developed a light source capable of synchronizing an oscillation pulse of a laser beam with modulation of a laser beam. The following description will proceed with an example in which a light source capable of synchronizing an oscillation pulse of a laser beam with modulation of a laser beam is used by a recording apparatus.

Hereinafter, an example of a light source and a recording apparatus according to an embodiment of the present disclosure will be described with reference to FIGS. 1 to 10. The embodiment of the present disclosure will be described in the following order. However, the present disclosure is not limited to the following example.

Figure 1:
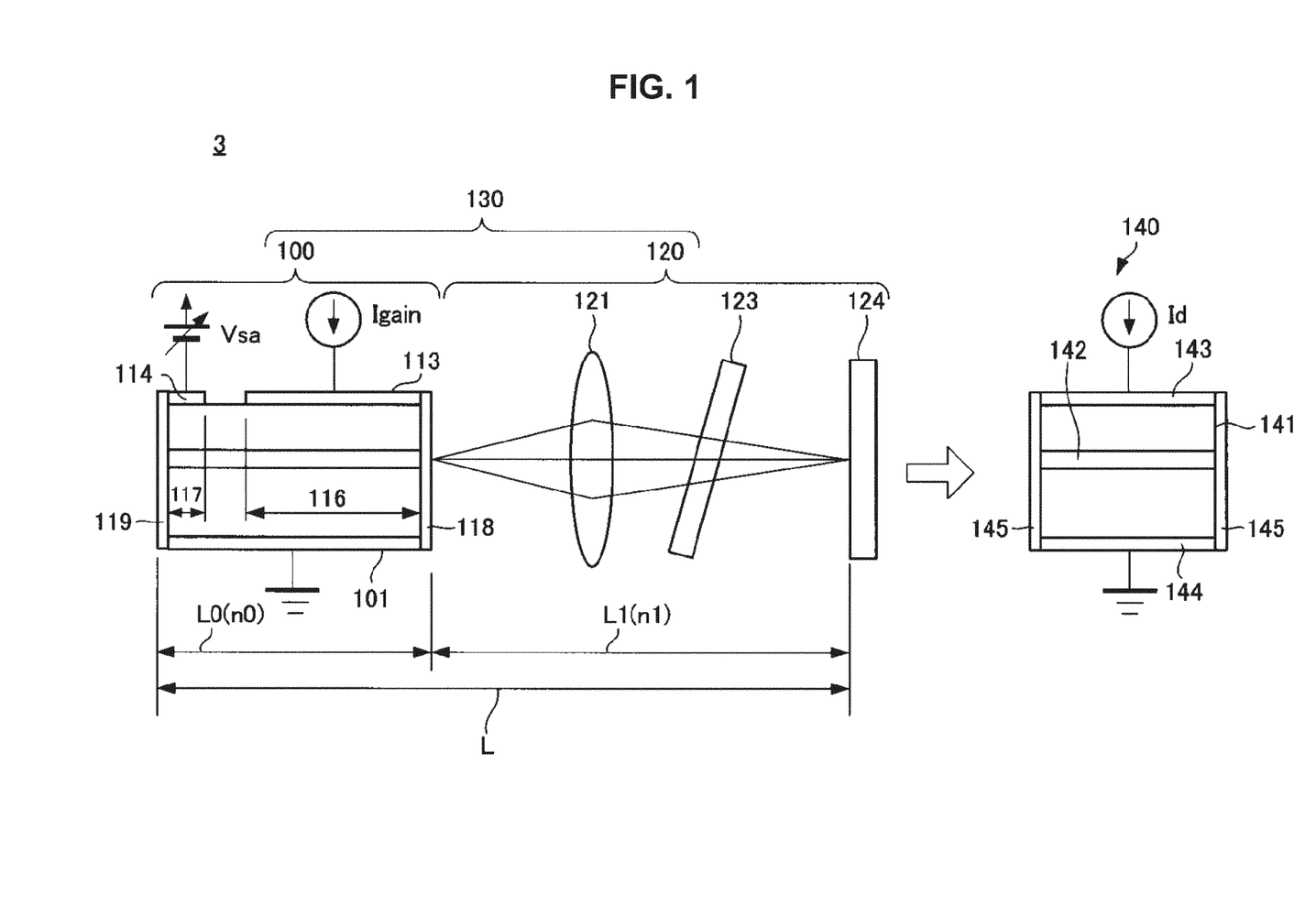
FIG. 1 is a schematic configuration diagram of an MOPA used in a recording apparatus according to an embodiment of the present disclosure.
Figure 2:
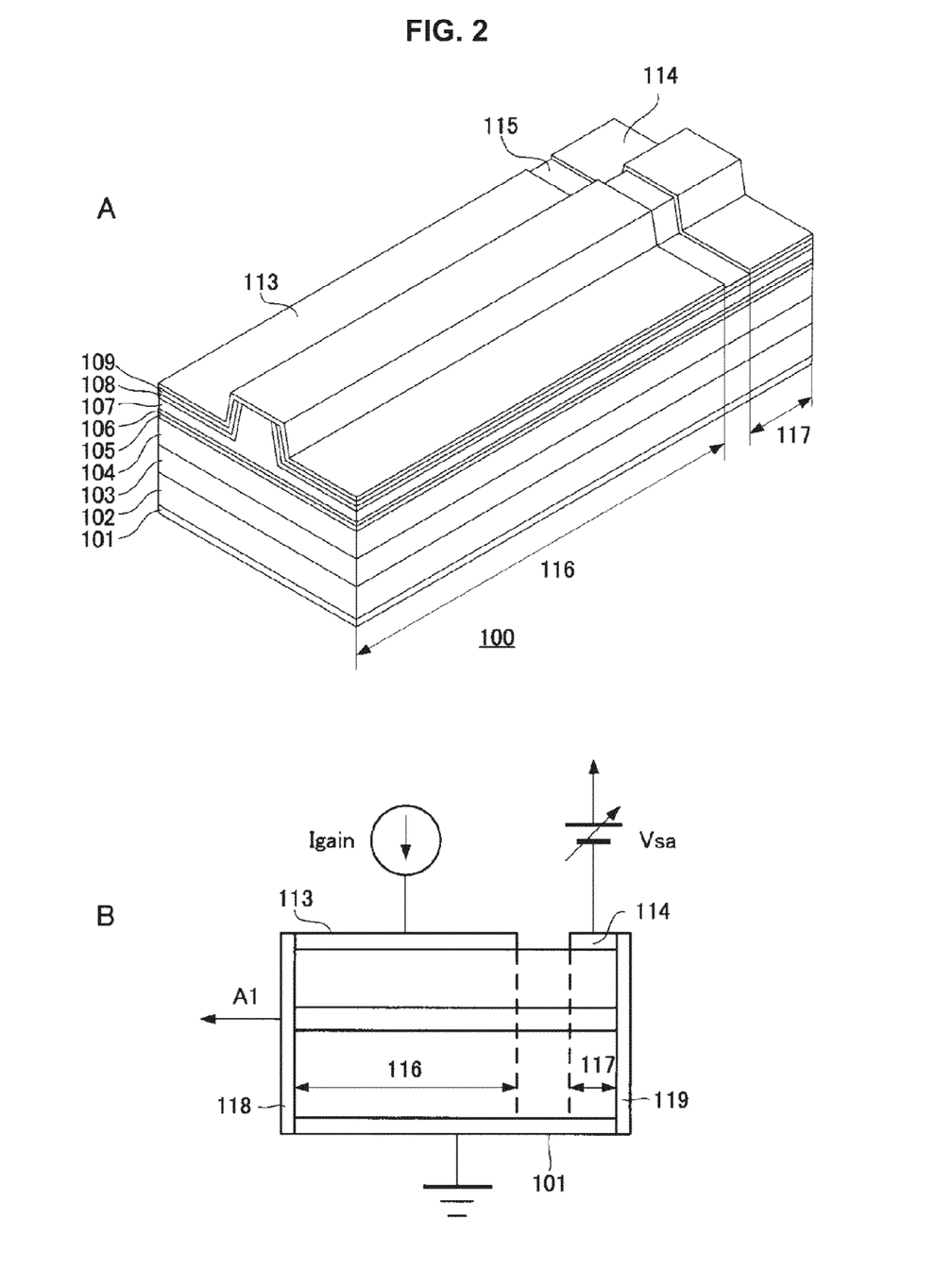
FIG. 2A is a perspective view of a semiconductor laser.
FIG. 2B is a schematic diagram illustrating a state in which a laser beam is emitted from a semiconductor laser.
Figure 3:
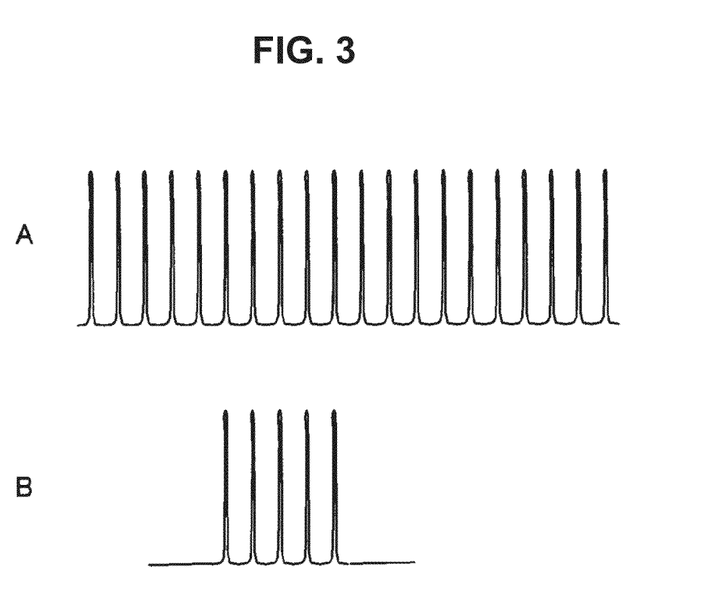
FIG. 3A illustrates a waveform of pulse light incident on a semiconductor optical amplifier.
FIG. 3B illustrates a waveform of pulse light emitted from a semiconductor optical amplifier.

1. Configuration of MOPA
1-1 Mode-Locking Laser Unit
1-2 Semiconductor Optical Amplifier
2. Configuration of Recording Apparatus
3. Method of Driving Recording Apparatus
4. Modified Example 1. Configuration of MOPA Before describing a light source and a recording apparatus according to an embodiment of the present disclosure (hereinafter, the present embodiment), an MOPA used in the light source and the recording apparatus according to the present embodiment will be described. FIG. 1 is a schematic configuration diagram of an MOPA3. Referring to FIG. 1, the MOPA3 includes a mode-lock laser unit 130 and a semiconductor optical amplifier 140.

[1-1 Mode-Locking Laser Unit]

First, the mode-lock laser unit 130 will be described. The mode-lock laser unit 130 includes a semiconductor laser 100 and an external resonator unit 120 as illustrated in FIG. 1. FIGS. 2A and 2B illustrate a schematic configuration of an embodiment of the semiconductor laser 100 that configures the mode-lock laser unit 130. FIG. 2A is a perspective view of the semiconductor laser 100, and FIG. 2B is a schematic diagram illustrating a state in which a laser beam is emitted from the semiconductor laser 100. The semiconductor laser 100 is a laser that outputs oscillation light (hereinafter, "pulse light") with the pulse width of picoseconds.

The semiconductor laser 100 is a bi-sectional type semiconductor laser configured with a saturable absorber unit 117 and a gain unit 116. The semiconductor laser 100 includes an n-type GaN substrate 102, a semiconductor layer having a double quantum well separated confinement heterostructure formed thereon, a main electrode 113, a sub electrode 114, and a lower electrode 101.

In the double quantum well separated confinement heterostructure, layers which are made of GaInN/GaN/AlGaN materials with the heterostructure are sequentially formed on the (0001) surface of the n-type GaN substrate 102. In other words, an n-type GaN layer 103, an n-type cladding layer 104, an active layer 105, a p-type electronic barrier layer 106, and a p-type cladding layer 107 are sequentially stacked on the n-type GaN substrate 102. A ridge structure is formed on the central portion of the p-type cladding layer 107 as illustrated in FIG. 2A. Further, a SiO2 layer 108 and a Si layer 109 are stacked on the side of the ridge and a portion of the p-type cladding layer 107 in which the ridge is not formed.

The main electrode 113 and the sub electrode 114 which are p-type electrodes are formed on the p-type cladding layer 107 and the Si layer 109 to have ohmic contact with the semiconductor layer therebelow. Here, the main electrode 113 is formed above the gain unit 116, and the sub electrode 114 is formed above the saturable absorber unit 117. For example, the main electrode 113 and the sub electrode 114 are electrically isolated from each other by a separating unit 115 having the structure with the width of 20 µm.

Here, the length of the main electrode 113 in a direction parallel to a direction in which the ridge portion extends is, for example, 520 µm, and the length of the sub electrode 114 in a direction parallel to a direction in which the ridge portion extends is, for example, 60 µm. The n-type lower electrode 101 is formed below the n-type GaN substrate 102 to have ohmic contact with the n-type GaN substrate 102.

For example, the heterostructure can be formed by a metal organic chemical vapor deposition (MOCVD) technique.

Further, the cleavage surface of the semiconductor laser 100 at the gain unit 116 side is coated with an anti-reflection film 118 (see FIG. 2B), and the cleavage surface of the semiconductor laser 100 at the saturable absorber unit 117 side is coated with a high-reflection film 119 (see FIG. 2B). Thus, in the semiconductor laser 100, an internal resonator is configured between the anti-reflection film 118 and the high-reflection film 119.

As illustrated in FIG. 2B, in the semiconductor laser 100, a reverse bias voltage Vsa is applied to the saturable absorber unit 117 through the sub electrode 114. At this time, a current (a gain current Igain) is applied to the gain unit 116 through the main electrode 113, and thus pulse light is emitted in a direction represented by an arrow A1. In the semiconductor laser 100, since the saturable absorber unit 117 is disposed, as intensity of light incident of an absorber increases, an absorption rate of the absorber decreases, and it is difficult for light having high intensity to pass through the absorber, and thus pulse light having a narrow pulse width oscillates.

The external resonator unit 120 includes a lens 121, a band pass filter 123, and a mirror 124 as illustrated in FIG. 1. The lens 121, the band pass filter 123, and the mirror 124 are arranged in order from the semiconductor laser 100 side in a light path of a laser beam emitted from the semiconductor laser 100. The laser beam that has passed through the external resonator unit 120 is incident on the semiconductor optical amplifier 140.

As the external resonator unit 120 is disposed, in the mode-lock laser unit 130, an external resonator (a space resonator) is configured between the high-reflection film 119 of the semiconductor laser 100 and the mirror 124. The frequency of the pulse light emitted from the mode-lock laser unit 130 is decided according to a light path length L of the external resonator. Thus, a mode of the pulse light can forcibly be locked to a specific frequency.

The light path length L of the external resonator can be obtained by the following Formula (1) using a light path length L0 of the internal resonator of the semiconductor laser 100, an internal refractive index n0 of the semiconductor laser 100, an external light path length L1 of the semiconductor laser 100, and a refractive index n1 of the external resonator unit 120.

$$L = n0 \cdot L0 + n1 \cdot L1 \tag{1}$$

[1-2 Semiconductor Optical Amplifier]

Next, the semiconductor optical amplifier 140 will be described. The semiconductor optical amplifier (SOA) 140 is an optical modulation device that performs amplification modulation on a laser beam emitted from the mode-lock laser unit 130. The semiconductor optical amplifier 140 is a small low-cost optical amplifier and can be used as an optical gate or an optical switch that turns on or off light. In the present embodiment, the laser beam emitted from the mode-lock laser unit 130 is modulated as the semiconductor optical amplifier 140 is turned on or off.

As illustrated in FIG. 1, the semiconductor optical amplifier 140 includes a semiconductor layer 141 configured such that a plurality of layers including an active layer 142 are stacked, an upper electrode 143 formed on the top surface of the semiconductor layer 141, and a lower electrode 144 formed on the under surface of the semiconductor layer 141. Further, the semiconductor optical amplifier 140 includes anti-reflection films 145 disposed on the side surfaces, which are opposite to each other, vertical to the top surface and the under surface of the semiconductor layer 141.

In the typical semiconductor laser, light is confined in the resonator configured with mirrors of both end surfaces, and a laser beam is oscillated according to an optical gain by an inter-band transition. On the other hand, in the semiconductor optical amplifier 140, the anti-reflection films 145 are disposed on both end surfaces as illustrated in FIG. 1 instead of the mirrors, suppress oscillation of a laser beam, and operate an amplifier that amplifies light corresponding to one pulse.

In the semiconductor optical amplifier 140, the laser beam emitted from the mode-lock laser unit 130 is incident through the incidence end surface on which the anti-reflection film 145 in a state in which the lower electrode 144 is connected to a ground potential, and a driving current Id is applied to the upper electrode 143 as illustrated in FIG. 1. At this time, the laser beam incident on the semiconductor optical amplifier 140 is amplified by induced emission while the laser beam is being guided in the active layer 142. Further, the laser beam emitted from the mode-lock laser unit 130 is not amplified in a state in which the driving current Id is not applied.

As described above, the semiconductor optical amplifier 140 is used as a modulation device that changes the driving current Id and performs amplification modulation on the laser beam emitted from the mode-lock laser unit 130. Further, in the semiconductor optical amplifier 140 according to the present embodiment, the amount of amplification of the laser beam can be controlled by controlling the current amount of the driving current Id to be applied. However, the laser beam incident on the semiconductor optical amplifier 140 needs not be necessarily amplified, and when sufficient laser beam power is obtained, a gain of the semiconductor optical amplifier 140 may be set to 1.

FIG. 3A illustrates a waveform of pulse light which is emitted from the mode-lock laser unit 130 and then incident on the semiconductor optical amplifier 140, and FIG. 3B illustrates a waveform of pulse light emitted from the semiconductor optical amplifier 140.

In the semiconductor optical amplifier 140, since a carrier lifetime is short, a high-speed response can be performed on a change in a current or light intensity. Thus, as a predetermined driving current Id is applied to the semiconductor optical amplifier 140 on consecutive pulse light which is input light from the mode-lock laser unit 130 as illustrated in FIG. 3A, for example, pulse light of a waveform illustrated in FIG. 3B is obtained as output light from the semiconductor optical amplifier 140. In other words, the semiconductor optical amplifier 140 can perform on/off control through the signal of the driving current Id applied to the upper electrode 143, and can be used as a high-speed optical switch that corresponds even to the frequency of an oscillation pulse from the mode-lock laser unit 130.

For example, when the semiconductor optical amplifier 140 is configured to amplify a laser beam having a wavelength of 407 nm, it is preferable that the semiconductor optical amplifier 140 be also configured such that the semiconductor layer 141 including the active layer 142 is made of the same material as the semiconductor laser that emits light having a wavelength of 407 nm.

As described above, the MOPA3 according to the present embodiment can modulate the laser beam output from the mode-lock laser unit 130 through the semiconductor optical amplifier 140 and then output the modulated laser beam. Further, modulation of a laser beam can be performed by changing the driving current Id to be supplied to the upper electrode 143 of the semiconductor optical amplifier 140.

2. Configuration of Recording Apparatus

Figure 4:
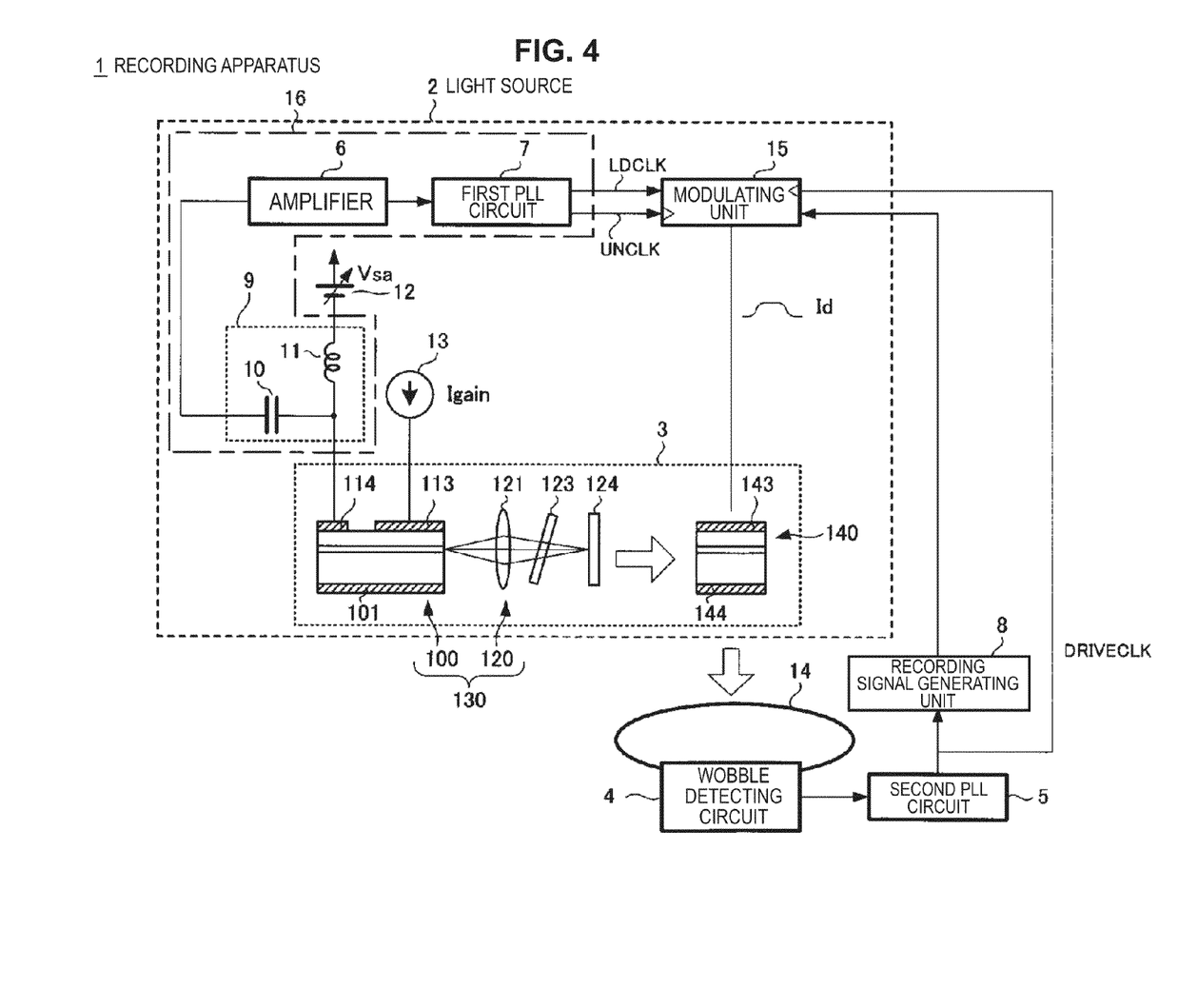
FIG. 4 is a schematic configuration diagram of a recording apparatus according to an embodiment of the present disclosure.
Figure 5:
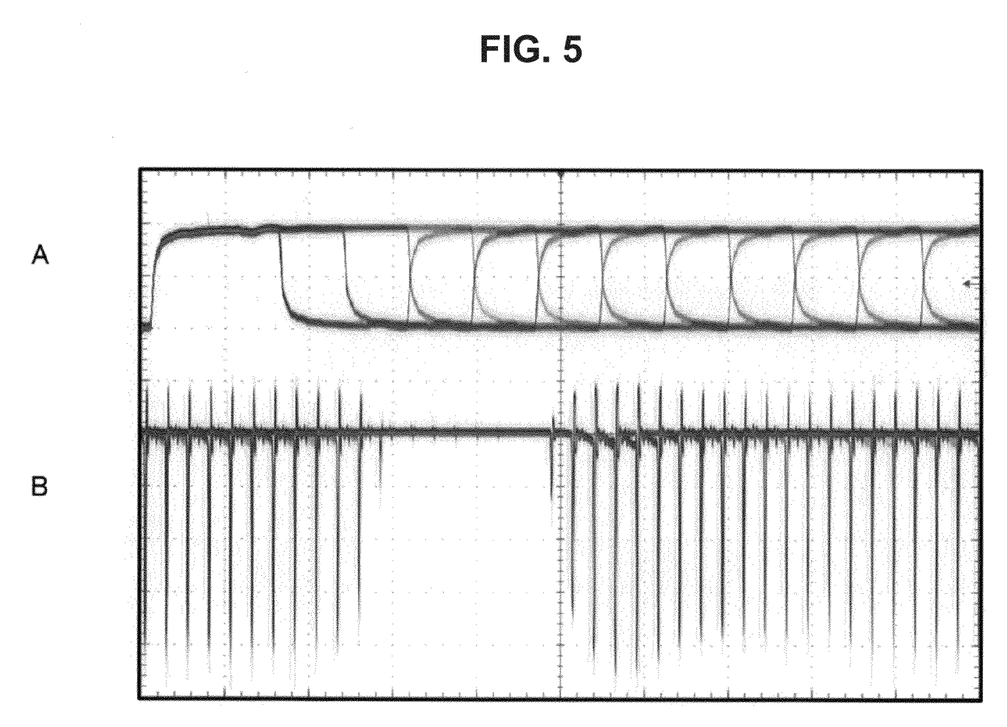
FIGS. 5A and 5B illustrate waveforms when recording data of random data is recorded as a test pattern using a recording apparatus according to an embodiment of the present embodiment.
Figure 6:
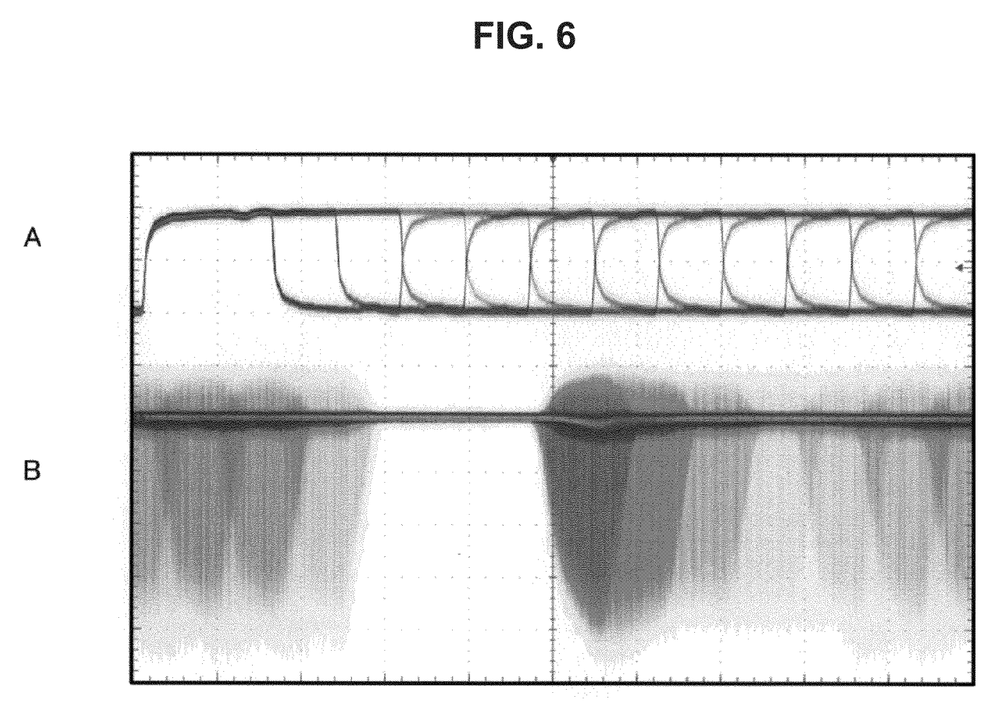
FIGS. 6A and 6B illustrate waveforms when recording data of random data is recorded as a test pattern using a recording apparatus according to a comparative example.

FIG. 4 illustrates a schematic configuration of a recording apparatus 1 according to an embodiment of the present disclosure. The recording apparatus 1 illustrated in FIG. 4 includes the MOPA3 illustrated in FIG. 1, a light source 2 that includes an amplifier 6, a first phase-locked loop (PLL) circuit 7, a modulating unit 15, a bias tee 9, a variable voltage source 12, and a current source 13, a wobble detecting circuit 4, a second PLL circuit 5, and a recording signal generating unit 8. Although not shown, the recording apparatus 1 includes an optical system that irradiates a laser beam emitted from the light source 2 to be focused on an optical recording medium 14, and various kinds of circuits for signal processing and operation control of the recording apparatus 1. In FIG. 4, the same components as in FIG. 1 are denoted by the same reference numerals, and a duplicated description will not be repeated.

The MOPA3 includes the mode-lock laser unit 130 configured with the semiconductor laser 100 and the external resonator 120, and the semiconductor optical amplifier 140 as described above. The current source 13 is connected to the main electrode 113 of the semiconductor laser 100, and the variable voltage source 12 is connected to the sub electrode 114 of the semiconductor laser 100 via a coil 11 of the bias tee 9. Although not shown, a ground potential is connected to the lower electrode 101 of the semiconductor laser 100.

The semiconductor laser 100 oscillates a pulse-like laser beam (hereinafter, "pulse light") by applying a predetermined gain current Igain to the main electrode 113 and supplying the reverse bias voltage Vsa to the sub electrode 114. The oscillated pulse light is locked to a specific frequency by the external resonator 120, and the pulse light locked to the specific frequency is input to the semiconductor optical amplifier 140.

The upper electrode 143 of the semiconductor optical amplifier 140 is connected to the modulating unit 15 which will be described later, and the lower electrode 144 is connected to a ground potential even though not shown. In the present embodiment, the driving current Id from the modulating unit 15 is supplied to the upper electrode 143 of the semiconductor optical amplifier 140.

In the semiconductor optical amplifier 140, the pulse light input from the mode-lock laser unit 130 is modulated according to the driving current Id input from the modulating unit 15. The pulse light modulated by the semiconductor optical amplifier 140 is irradiated to the optical recording medium 14 that is rotationally driven by a spindle motor (not shown).

The bias tee 9 is configured with the coil 11 and a capacitor 10, the coil 11 is disposed between the sub electrode 114 of the semiconductor laser 100 and the variable voltage source 12, and the capacitor 10 is disposed between the sub electrode 114 of the semiconductor laser 100 and the amplifier 6.

Meanwhile, in the semiconductor laser 100, a weak signal that has the same frequency as the pulse light oscillated from the mode-lock laser unit 130 and is synchronized with the pulse light is known to leak to the electrode (that is, the sub electrode 114) of the saturable absorber unit 117 at the time of oscillation of the pulse light. Thus, in the present embodiment, the weak signal synchronized with the pulse light oscillated from the mode-lock laser unit 130 flows from the sub electrode 114 of the saturable absorber unit 117 to the bias tee 9 side. The weak signal flowing to the bias tee 9 side is divided into an alternating current (AC) component and a direct current (DC) component by the bias tee 9, and a high frequency signal including an AC component is transferred to the amplifier 6. In other words, in the present embodiment, the bias tee 9 is used as a filter for extracting an AC component from the saturable absorber unit 117.

The amplifier 6 amplifies the high frequency signal transferred from the saturable absorber unit 117 of the semiconductor laser 100 via the capacitor 10, and inputs the amplified high frequency signal to the first PLL circuit 7. The first PLL circuit 7 converts the high frequency signal transferred from the amplifier 6 into a stable clock signal (hereinafter, "laser clock LDCLK"). As described above, in the present embodiment, the bias tee 9 and the amplifier 6 configure a detecting unit that detects the laser clock LDCLK from the saturable absorber unit 117. The laser clock LDCLK synthesized with the pulse light oscillated from the mode-lock laser unit 130 is input from the first PLL circuit 7 to the modulating unit 15.

When a problem occurs in the mode-lock laser unit 130, the problem is detected by the first PLL circuit 7, and then an unclock signal UNCLK is supplied from the first PLL circuit 7 to the modulating unit 15 as illustrated in FIG. 4. In this case, the operation of the recording apparatus 1 is switched so that a signal other than the laser clock LDCLK is used as a reference. Thus, an abnormal recording operation can primarily be avoided. At this time, for example, a drive clock DRIVECLK which will be described later may be used as the signal used as the reference.

In the present embodiment, a laser clock generating unit 16 that generates the laser clock LDCLK is configured with the bias tee 9, the amplifier 6, and the first PLL circuit 7 that configure a filter.

The wobble detecting circuit 4 is electrically connected to the recording signal generating unit 8 via the second PLL circuit 5. The wobble detecting circuit 4 detects a wobble formed in the optical recording medium 14 and generates the drive clock DRIVECLK. The drive clock DRIVECLK generated by the wobble detecting circuit 4 is supplied to the recording signal generating unit 8 through the second PLL circuit 5. Further, as described above, when the laser clock LDCLK detected from the mode-lock laser unit 130 is abnormal, the drive clock DRIVECLK is also supplied to the modulating unit 15.

The configuration of supplying the unclock signal UNCLK to the modulating unit 15 and the configuration of supplying the drive clock DRIVECLK to the modulating unit 15 are not the configurations which are necessarily used by the recording apparatus of the present disclosure. When a problem does not occur in an operation of the recording apparatus, the above configurations can be omitted.

The recording signal generating unit 8 generates a data pulse by putting recording data on the drive clock DRIVECLK supplied from the second PLL circuit 5. Then, the data pulse generated by the recording signal generating unit 8 is supplied to the modulating unit 15.

The modulating unit 15 is connected to the first PLL circuit 7, the second PLL circuit 5, and the semiconductor optical amplifier 140. The modulating unit 15 latches the data pulse supplied from the second PLL circuit 5 by the laser clock LDCLK supplied from the first PLL circuit 7 once, and then generates the driving current Id based on the latched data pulse. The driving current Id generated by the modulating unit 15 is applied to the semiconductor optical amplifier 140. As a result, the semiconductor optical amplifier 140 is modulation-driven by the driving current Id applied from the modulating unit 15.

3. Method of Driving Recording Apparatus

A method of driving the recording apparatus 1 with the above configuration will be described.

First, a predetermined gain current Igain is supplied from the current source 13 to the main electrode 113 of the semiconductor laser 100, and a predetermined reverse bias voltage Vsa is supplied from the variable voltage source 12 to the sub electrode 114 of the semiconductor laser 100 via the coil 11. As a result, pulse light is emitted from the semiconductor laser 100. Then, the pulse light emitted from the semiconductor laser 100 is forcibly locked to, for example, a frequency of 1 GHz by the external resonator 120. Thus, pulse light of 1 GHz is emitted from the mode-lock laser unit 130.

Meanwhile, in the semiconductor laser 100, the weak signal that has the same frequency as the pulse light oscillated from the mode-lock laser unit 130 and is synchronized with the pulse light is supplied from the sub electrode 114 configuring the saturable absorber unit 117 to the bias tee 9. The weak signal is divided into an AC component and a DC component by the bias tee 9, and the high frequency signal including the AC component is output from the capacitor 10 configuring the bias tee 9. The high frequency signal output from the capacitor 10 is input to the amplifier 6, amplified by the amplifier 6, and then input to the first PLL circuit 7. The high frequency signal input to the first PLL circuit 7 is output as the stable laser clock LDCLK, and the laser clock LDCLK is input to the modulating unit 15.

Further, data pulse generated by the recording signal generating unit 8 is input to the modulating unit 15. The modulating unit 15 latches the data pulse by the laser clock LDCLK input from the first PLL circuit 7, and the latched data pulse is input to the upper electrode 143 of the semiconductor optical amplifier 140 as the driving current Id.

As a result, the pulse light input from the mode-lock laser unit 130 to the semiconductor optical amplifier 140 is modulated by the driving current Id input to the semiconductor optical amplifier 140, and the modulated pulse light is irradiated to the optical recording medium 14. As a result, recording data is written in the optical recording medium 14.

In the present embodiment, the laser clock LDCLK is the signal detected by extracting and amplifying the high-frequency component of the weak signal leaked to the sub electrode 114 of the saturable absorber unit 117 of the semiconductor laser 100, and is in synchronization with the pulse signal emitted from the mode-lock laser unit 130. Thus, as the driving current Id synchronized with the laser clock LDCLK is applied to the semiconductor optical amplifier 140, the pulse light emitted from the mode-lock laser unit 130 can be synchronized with modulation of the pulse light. As a result, high-density recording can reliably be implemented at a high-speed.

FIG. 5A illustrates a waveform of a driving current when recording data of a random pattern is recorded as a test pattern using the recording apparatus 1 according to the present embodiment, and FIG. 5B illustrates a waveform of pulse light oscillated from the semiconductor optical amplifier 140 at this time. FIG. 6A illustrates a waveform of a driving current when recording data of a random pattern is recorded as a test pattern using a recording apparatus according to a comparative example, and FIG. 6B illustrates a waveform of pulse light oscillated from the semiconductor optical amplifier at this time. The recording apparatus according to the comparative example is configured such that the bias tee 9, the amplifier 6, and the first PLL circuit 7 are excluded from the recording apparatus 1 illustrated in FIG. 4, and the driving current Id is in synchronization with the data pulse input from the recording signal generating unit 8.

FIGS. 5A and 5B and FIGS. 6A and 6B illustrate the waveforms in which the gain current Igain is 70 mA, the reverse bias voltage Vsa is −12 V, and a maximum value of the driving current Id applied to the semiconductor optical amplifier 140 is 1.4 A. In FIGS. 5B and 6B, pulse light is illustrated to overlap data of each pattern length.

As illustrated in FIG. 6B, in the recording apparatus according to the comparative example, it can be understood that a peak of each pulse light emitted from the semiconductor optical amplifier 140 is unclear, and a synchronization characteristic of each pulse light is turbulent.

On the other hand, in the recording apparatus 1 according to the present embodiment, the pulse light emitted from the mode-lock laser unit 130 is synchronized with the driving current Id. Thus, it can be understood that synchronization of the pulse light corresponding to data of each pattern length is obtained as illustrated in FIG. 5B.

Meanwhile, as a method of generating the laser clock LDCLK synchronized with the pulse light emitted from the mode-lock laser unit 130, a method of detecting the pulse light emitted from the mode-lock laser unit 130 and generating the laser clock LDCLK based on the detected pulse light is also considered. However, in this case, a plurality of optical elements for acquiring the pulse light emitted from the mode-lock laser unit 130 are necessary.

However, in the present embodiment, the laser clock LDCLK synchronized with the pulse light emitted from the mode-lock laser unit 130 can be generated from the weak signal leaked to the saturable absorber unit 117 of the semiconductor laser 100. Thus, in this case, an optical element for detecting the pulse light emitted from the mode-lock laser unit 130 is unnecessary compared to when the pulse light emitted from the mode-lock laser unit 130 is used. Thus, in the present embodiment, the light source 2 and the recording apparatus 1 can be reduced in the size and in the manufacturing cost.

In addition, in the recording signal generating unit 8, a data pulse is transferred to the modulating unit 15 for each recording unit of an address of a wobble detected by the drive clock DRIVECLK, and the phase of the wobble can be synchronized with an oscillation pulse of a laser beam for each recording unit. However, since the address of the wobble is not perfectly synchronized with an oscillation pulse of a laser beam, an end position of the recording unit does not match a recording start position of the recording unit. In this regard, a configuration in which a buffer is disposed in a connective portion of each recording unit is applied.

Figure 7:
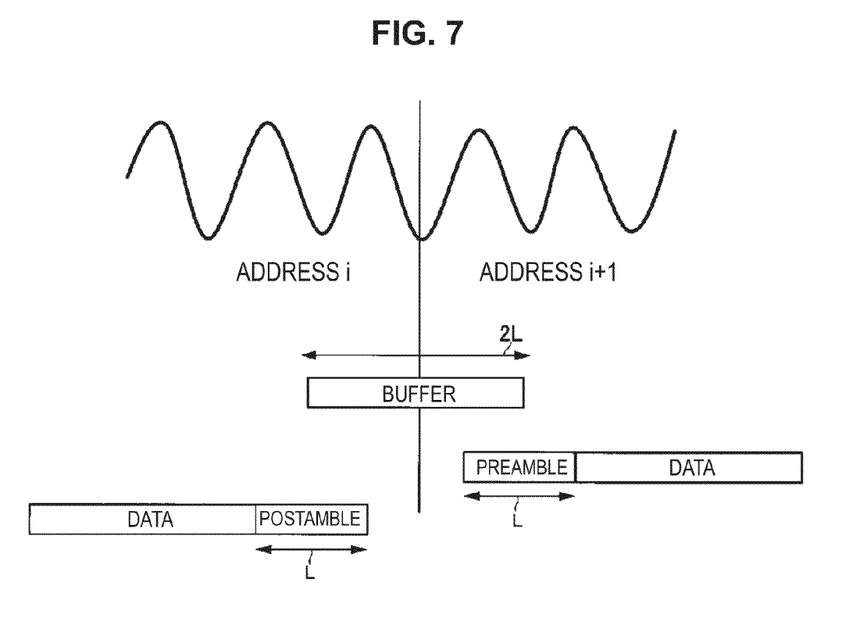
FIG. 7 is a diagram for describing a configuration in which a portion (a so-called buffer) used as recording data is disposed in a connective portion of each recording unit.

FIG. 7 is a diagram for describing a configuration in which a portion (a so-called buffer) used as a recording data region is disposed in a connective portion of each recording unit. As illustrated in FIG. 7, for example, a preamble having no data and a postamble having no data are disposed in the head and the rail of recording data, respectively, so that overlapping of recording data is not concerned in the connective portion. Each of the preamble and the postamble has a length L, and a buffer having a length of 2L is disposed in the connective portion. As described above, a buffer for coping with accumulation of an address position detection error an inter-clock error of a recording unit is disposed, and overlapping of recording data can be avoid.

4. Modified Example

Next, a modified example of the recording apparatus 1 according to the above-described embodiment will be described. In the recording apparatus according to the modified example, a memory buffer is disposed in the modulating unit 15 illustrated in FIG. 4 even though not shown. It is because an error at the time of data latching in the modulating unit 15 due to a difference between the drive clock DRIVECLK and the laser clock LDCLK is prevented.

Figure 8:
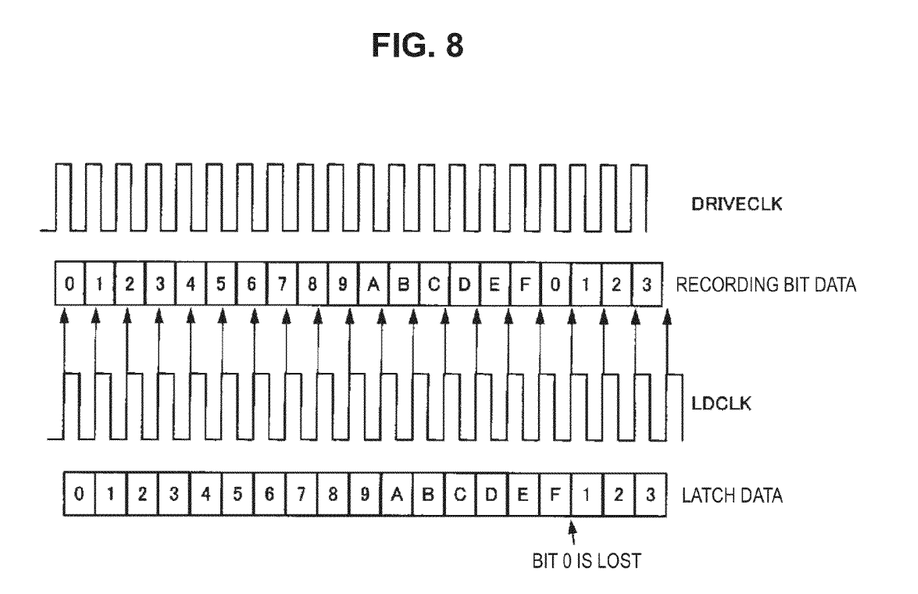
FIG. 8 is a diagram illustrating loss of a bit when data is latched in units of bits.

FIG. 8 is a diagram illustrating loss of a bit when data is latched in units of bits, and illustrates recording byte data and latch data corresponding thereto. As illustrated in FIG. 8, when data is latched in units of bits, loss of a bit may occur. In FIG. 8, as indicated by arrows, recording bit data is latched at a rising edge of the pulse of the laser clock LDCLK, but a bit of data 0 is lost due to the difference in the pulse width between the drive clock DRIVECLK and the laser clock LDCLK.

Figure 9:
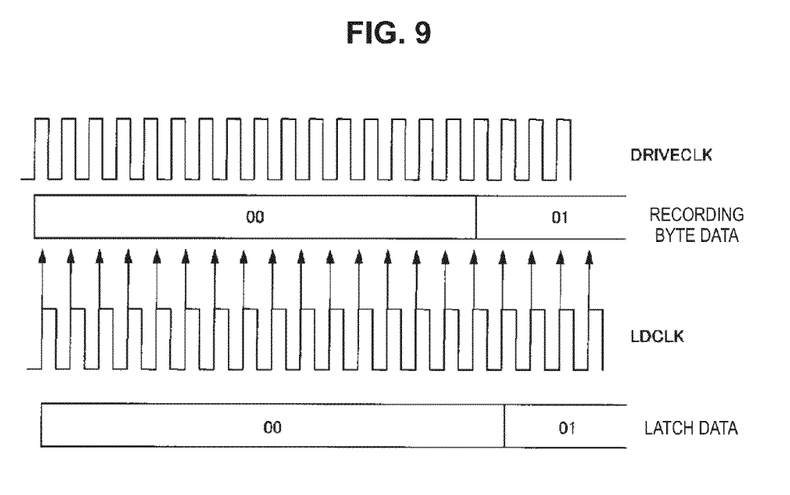
FIG. 9 is a diagram illustrating when data transfer is performed in units of two bytes.

FIG. 9 illustrates recording byte data and latch data corresponding thereto when data transfer is performed in units of two bytes. As illustrated in FIG. 9, when data transfer from the recording signal generating unit 8 to the modulating unit 15 is performed in units of two bytes, loss can be reduced. In other words, a function of transferring data of a word unit having a certain length to be accumulated in the memory buffer of the modulating unit 15 so that a clock difference is absorbed is necessary.

Figure 10:
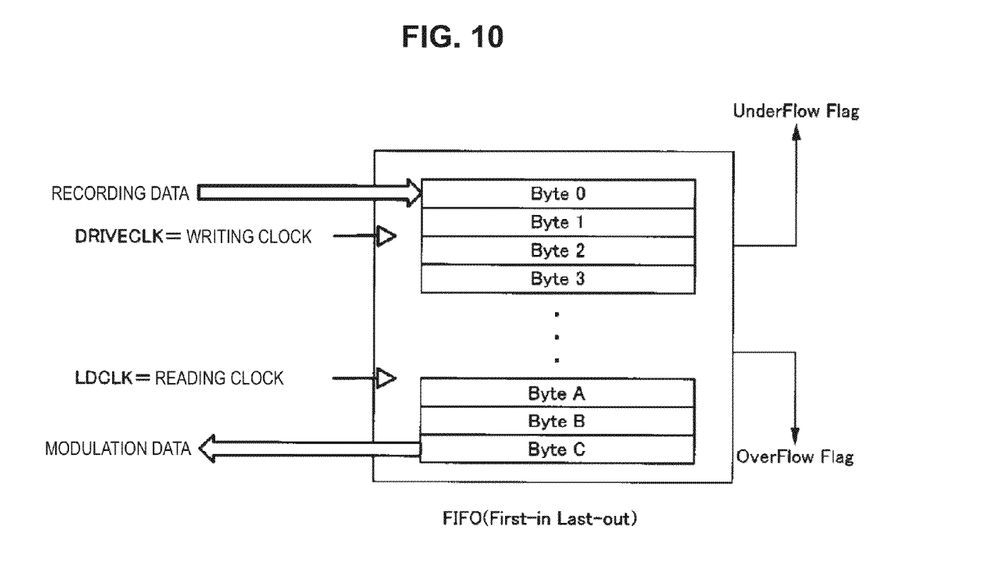
FIG. 10 is a diagram for describing pipeline processing by a memory using a FIFO.

In this regard, pipeline processing of sequentially transferring data of different clocks is performed by a memory using a first in first out (FIFO) as illustrated in FIG. 10. Thus, the difference in the data transfer rate due to the drive clock DRIVECLK serving as a writing clock and the laser clock LDCLK serving as a reading clock is absorbed. The remaining configuration may be the same as in the above-described embodiment.

In the recording apparatus according to the modified example, more preferably, when the remaining amount (the amount of space) of the memory buffer becomes deficient due to the transfer rate difference or when the capacity of the memory buffer is expended out, a control flag is transferred to the drive of the optical recording medium 14 to control the transfer or recording. UnderFlowFlag and OverFlowFlag illustrated in FIG. 10 may be used as the control flag. In the recording apparatus 1 of FIG. 4, for example, the control flags are assumed to be transferred from the modulating unit 15 to the recording signal generating unit 8. Thus, even when the difference in the transfer rate is large, the transfer or recording is controlled such that recording data is not lost.

In the recording apparatus according to the modified example, more preferably, an error of read data is detected by the laser clock LDCLK, and writing suspension or correction is performed. Thus, erroneous data can be prevented from being written in the optical recording medium 14.

According to the recording apparatus according to the modified example, similarly to the recording apparatus 1 according to the present embodiment, an oscillation pulse of a laser beam can be synchronized with modulation of a laser beam. Thus, even in the case of the laser having a very high pulse light frequency, an oscillation pulse of a laser beam can easily be synchronized with modulation of a laser beam. Thus, the recording apparatus can reliably implement high-density recording at a high speed.

In addition, according to the recording apparatus according to the modified example, the memory buffer is disposed in the modulating unit 15 to absorb the difference in the data transfer rate caused by the difference between the drive clock DRIVECLK and the laser clock LDCLK. Thus, even when the difference in the data transfer rate is caused due to the difference between the drive clock DRIVECLK and the laser clock LDCLK, recording can properly be performed without recording omission of data.

In the recording apparatus 1, the optical recording medium 14 to be used has a disk form and is configured to record information while rotating the optical recording medium 14, but the present application can be applied to a recording apparatus having any other configuration. For example, the present application can be applied to a configuration in which a card-like optical recording medium is scanned with a laser beam to record information in an optical recording medium.

Further, in the recording apparatus 1, the drive clock DRIVECLK is generated based on the wobble formed in the optical recording medium 14. In the present disclosure, the reference signal from the drive of the optical recording medium is not limited to a signal based on the wobble, and a signal having any other configuration may be used as the reference signal from the drive. For example, a configuration for any other address reference may be formed in an optical recording medium instead of a wobble, and the reference signal from the drive may be generated using this configuration.

Furthermore, the above-described embodiment has been described in connection with the example in which a light source is used in a recording apparatus, but the light source of the present disclosure is not limited to an application to a recording apparatus and may be applied to, for example, an electronic device such as a two-photon microscope used in a laser processing apparatus.

The present disclosure is not limited to the above embodiments, and can have various configurations within in a range not departing from the gist of the present disclosure.

Additionally, the present application may also be configured as below.

(1) A light source, including:
a mode-lock laser unit that includes a semiconductor laser and an external resonator and emits a laser beam having a predetermined frequency, the semiconductor laser including a saturable absorber unit that applies a reverse bias voltage and a gain unit that applies a gain current;
a semiconductor optical amplifier that performs amplification modulation on the laser beam emitted from the mode-lock laser unit;
a detecting unit that detects a laser clock synchronized with the laser beam from the saturable absorber unit when the laser beam oscillates in the mode-lock laser unit; and
a modulating unit that generates a driving current synchronized with the laser clock and applies the driving current to the semiconductor optical amplifier.

(2) The light source according to (1),
wherein the detecting unit includes a filter that extracts a high-frequency component from a signal output from an electrode to which the reverse bias voltage of the saturable absorber unit is applied and an amplifier that amplifies the high-frequency component.

(3) A recording apparatus, including:
a mode-lock laser unit that includes a semiconductor laser and an external resonator and emits a laser beam having a predetermined frequency, the semiconductor laser including a saturable absorber unit that applies a reverse bias voltage and a gain unit that applies a gain current;
a semiconductor optical amplifier that performs amplification modulation on the laser beam emitted from the mode-lock laser unit;
a detecting unit that detects a laser clock synchronized with the laser beam emitted from the mode-lock laser unit from a signal obtained by the saturable absorber unit when the laser beam oscillates in the mode-lock laser unit; and
a recording signal generating unit that generates a recording signal based on a reference signal from a drive of an optical recording medium; and
a modulating unit that latches the recording signal by the laser clock, and generates a driving current to be applied to the semiconductor optical amplifier.

(4) The recording apparatus according to (3),
wherein the reference signal from the drive is a signal obtained from a wobble formed in the optical recording medium.

(5) The recording apparatus according to (3) or (4), further including:
a memory buffer that is disposed in the modulating unit and absorbs a difference in a data transfer rate caused due to a difference between the reference signal from the drive and the laser clock.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light source, comprising:
  a mode-lock laser unit that includes a semiconductor laser and an external resonator unit and emits a laser beam having a predetermined frequency, the semiconductor laser including a saturable absorber unit that applies a reverse bias voltage and a gain unit that applies a gain current;
  a semiconductor optical amplifier that performs amplification modulation on the laser beam emitted from the mode-lock laser unit;
  a laser clock generating unit that generates a laser clock synchronized with the laser beam based on a signal detected from the saturable absorber unit when the laser beam oscillates in the mode-lock laser unit; and
  a modulating unit that generates a driving current synchronized with the laser clock and applies the driving current to the semiconductor optical amplifier,
  wherein the laser clock generating unit includes a filter that extracts a high-frequency component from a signal output from an electrode to which the reverse bias voltage of the saturable absorber unit is applied and an amplifier that amplifies the high-frequency component.

2. An apparatus, comprising:
  a mode-lock laser unit that includes a semiconductor laser and an external resonator unit and emits a laser beam having a predetermined frequency, the semiconductor laser including a saturable absorber unit that applies a reverse bias voltage and a gain unit that applies a gain current;

a semiconductor optical amplifier that performs amplification modulation on the laser beam emitted from the mode-lock laser unit;

a laser clock generating unit that generates a laser clock synchronized with the laser beam from a signal detected from the saturable absorber unit when the laser beam oscillates in the mode-lock laser unit; and a modulating unit that latches a signal from a signal generating unit by the laser clock, and generates a driving current to be applied to the semiconductor optical amplifier, wherein the laser clock generating unit includes a filter that extracts a high-frequency component from a signal output from an electrode to which the reverse bias voltage of the saturable absorber unit is applied and an amplifier that amplifies the high-frequency component.

* * * * *